United States Patent [19]

Toyama et al.

[11] Patent Number: 4,847,465
[45] Date of Patent: Jul. 11, 1989

[54] REFLOW SOLDERING APPARATUS

[75] Inventors: Toshio Toyama; Kazuya Kato; Tadamasa Tanaka; Masashi Yajima; Harutaka Hayasaka; Toru Arai; Hitoshi Terada, all of Saitama, Japan

[73] Assignee: Sony Corporation, Tokyo, Japan

[21] Appl. No.: 902,635

[22] Filed: Sep. 2, 1986

[30] Foreign Application Priority Data

Oct. 11, 1985 [JP] Japan .................... 60-226375

[51] Int. Cl.⁴ .................... H05K 3/34; B23K 31/02
[52] U.S. Cl. .................... 219/85.1; 219/373; 219/85.12; 228/180.2
[58] Field of Search ............ 219/373, 374, 381, 79, 219/85 R, 85 BA, 85 BM, 85 E; 228/36, 43, 45, 47, 180.1, 240, 243, 260, 180.2

[56] References Cited

U.S. PATENT DOCUMENTS

| | | | |
|---|---|---|---|
| 3,825,994 | 7/1974 | Coleman | 228/240 |
| 4,574,182 | 3/1986 | Pescatore et al. | 219/390 X |
| 4,580,716 | 4/1986 | Barresi et al. | 228/219 |
| 4,605,152 | 8/1986 | Fridman | 219/373 X |
| 4,610,388 | 9/1986 | Koltuniak et al. | 219/373 X |
| 4,771,929 | 9/1988 | Bahr et al. | 228/180.2 X |

Primary Examiner—Patrick R. Salce
Assistant Examiner—Emanuel Todd Voeltz
Attorney, Agent, or Firm—Ronald P. Kananen

[57] ABSTRACT

A reflow soldering apparatus for soldering parts which are temporarily fixed on a substrate by using cream solder. The apparatus includes a hot gas blower provided with a number of holes for blowing hot gas through the holes. The apparatus also includes a substrate moving mechanism for moving the substrate along the hot gas blower at a distance therefrom to expose the substrate to hot gas blown through the holes, thereby reflowing the cream solder.

12 Claims, 4 Drawing Sheets

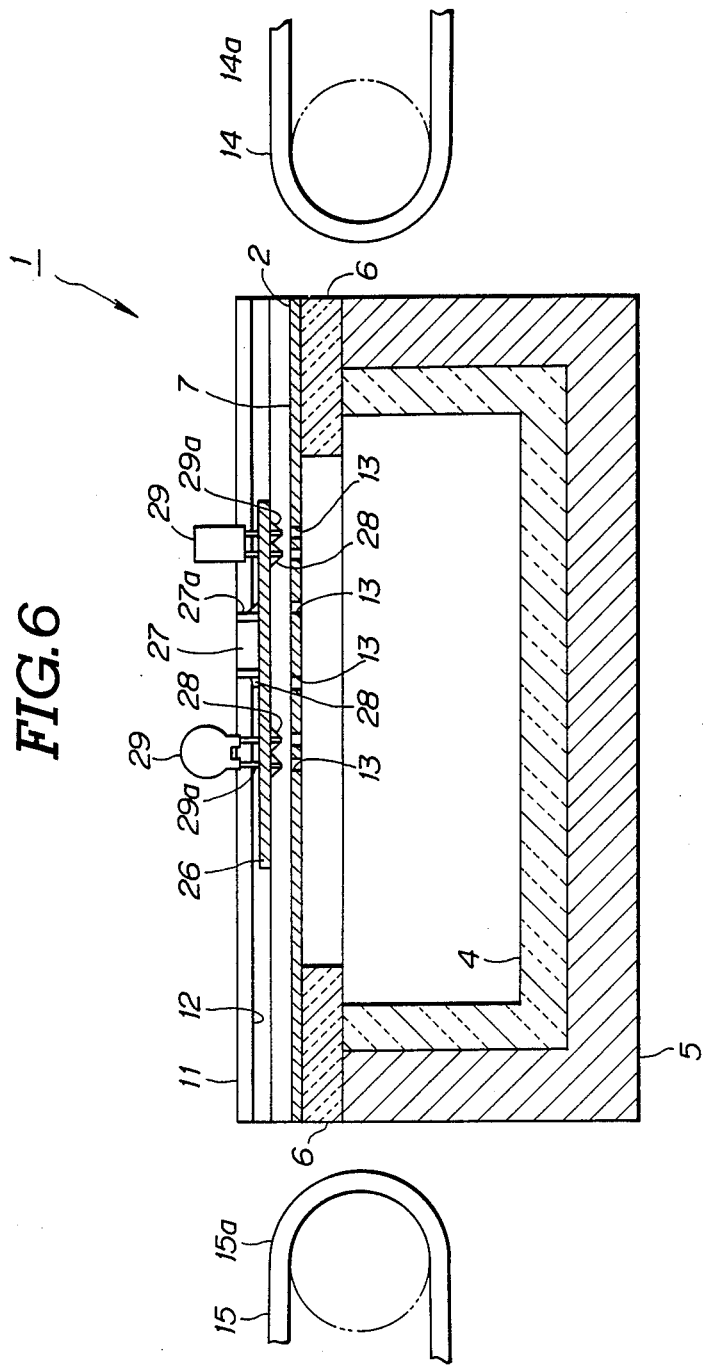

REFLOW SOLDERING APPARATUS

BACKGROUND OF THE INVENTION

This invention relates to a reflow soldering apparatus for soldering parts which are temporarily fixed on a substrate by means of cream solder.

Reflow soldering techniques have been used tp solder electrical parts on a substrate by applying heat to melt and re-solidify (reflow) the cream solder used to temporarily fix the electrical parts on the substrate. A conventional open-type reflow soldering apparatus employs a hot iron plate to reflow the cream solder when the substrate is moved in contact with the hot iron plate. However, such a conventional apparatus presents several difficulties. First, if the substrate is curved or deformed to such an extent that it has a portion lifted off the hot iron plate, an additional process is required to flaten the substrate by means of a suitable flattening tool in order to avoid insufficient soldering. Second, the apparatus cannot be used in soldering parts having lead wires which extend from the substrate to lift off the substrate from the hot iron plate.

In order to avoid these difficulties, it has been proposed to move the substrate in an atmosphere of hot gas created in a heating furnace. However, this soldering technique cannot be used when soldering is required only for a part of the substrate or when the parts are thermolabile. In addition, it provides a great degree of thermal stress which degraded the reliability of the parts, particularly after reflowing twice.

SUMMARY OF THE INVENTION

A main object of the invention is to provide an improved reflow soldering apparatus which can be used for a greater range of applications.

It is another object of the invention to provide such a reflow soldering apparatus which can minimize the thermal stress applied to the soldered parts during reflowing.

There is provided, in accordance with the invention, a reflow soldering apparatus for soldering parts which are temporarily fixed on a substrate by means of cream solder. The apparatus comprises a hot gas blower provided with a number of holes for blowing hot gas through the holes. The apparatus also comprises means for moving the substrate along the hot gas blower at a distance therefrom to expose the substrate to hot gas blown through the holes, thereby reflowing the cream solder.

BRIEF DESCRIPTION OF THE DRAWINGS

The features of this invention which are believed to be novel are set forth with particularity in the appended claims. The invention together with its further objects and advantages thereof, may be best understood, however, by reference to the following description taken in conjunction with the accompanying drawings, in which like reference numerals identify like elements in the several figures and in which:

FIG. 6 is a section taken on line VI—VI in FIG. 1.

DESCRIPTION OF THE PREFERRED EMBODIMENT

Figure 1:
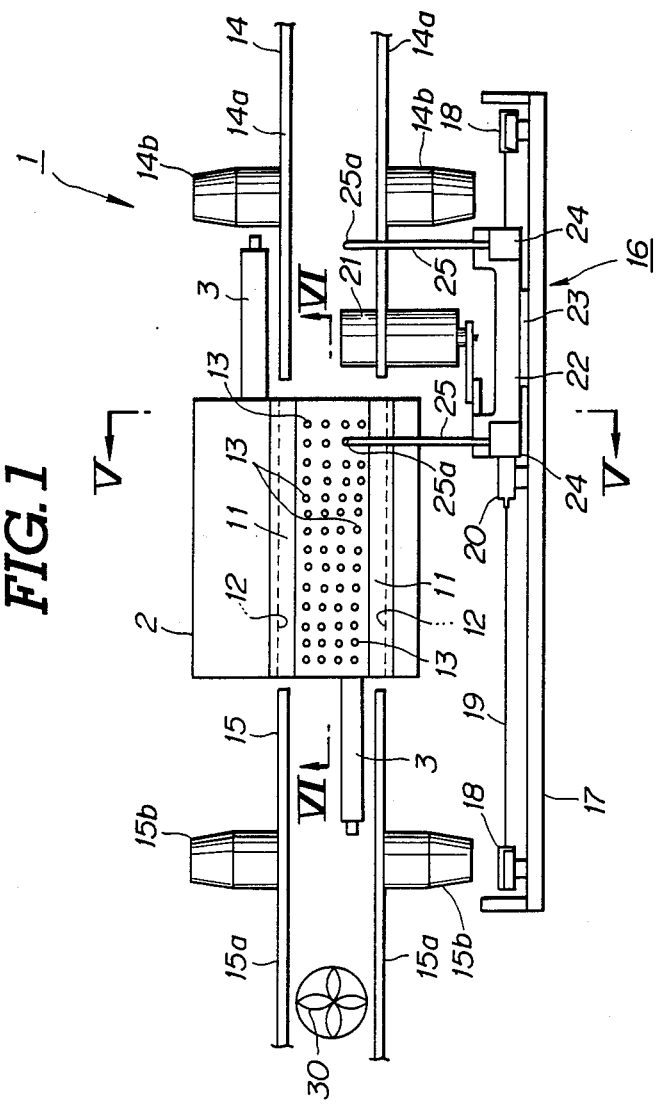
FIG. 1 is a plan view showing one embodiment of a reflow soldering apparatus made in accordance with the invention.

With reference to the drawings and in particular to FIG. 1, there is shown a reflow soldering apparatus embodying the invention. While the invention will be described in connection with the reflow soldering of electrical parts temporarily fixed on a substrate by means of cream solder, it will be appreciated that it is not limited in any way to this application and is equally applicable to the reflow soldering of other parts.

The reflow soldering apparatus, designated generally by the numeral 1, includes a hot gas blower which comprises a hot gas generator and a housing 2 defining therein a hot gas chamber. The hot gas generator is shown as including two heat pipes 3 adapted to introduce hot gas into the hot gas chamber. The housing 2 has a perforated portion provided with a number of holes 13 through which hot gas blows out.

Figure 2:
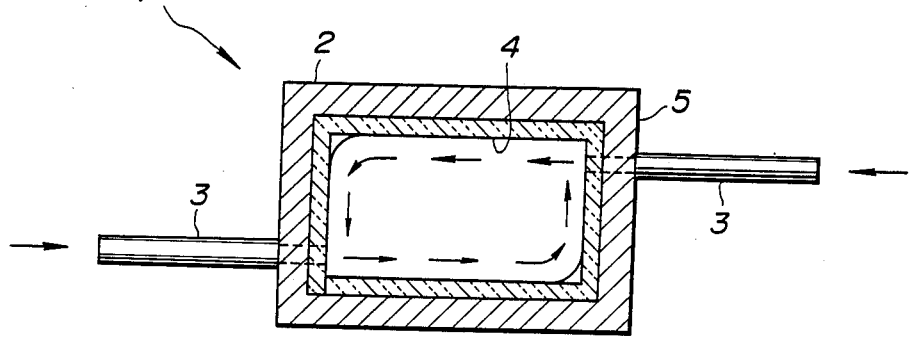
FIG. 2 is a horizontal sectional view of the hot gas generator.
Figure 3:
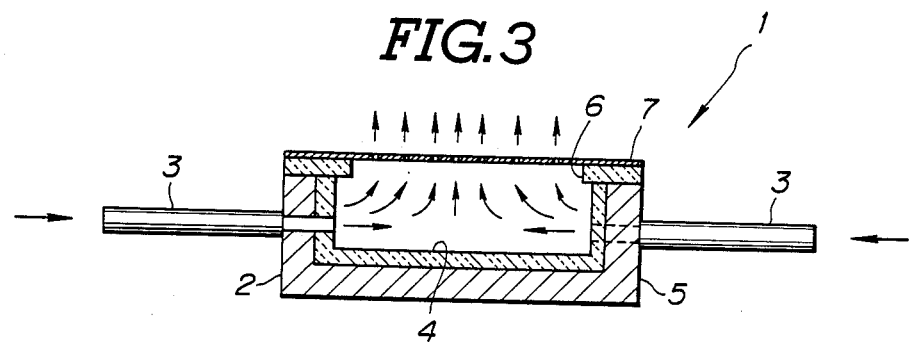
FIG. 3 is a longitudinal section view of the hot gas generator.

Referring to FIGS. 2 and 3, the housing 2 has double-formed walls except for the perforated portion. The inner wall 4 is made of a heat insulating material such for example as asbestos, and the outer wall 5 is made of aluminum. The top wall comprises a frame 6 made of a heat insulating material and a top plate 7 deposited on the frame 6. The top plate 7 is provided with a number of holes 13 to form the perforated portion. Preferably, the top plate 7 is made of brass. One of the heat pipes 3 extends through one side wall of the housing 2 and opens into the hot gas chamber. The other heat pipe 3 extends through the opposite side wall of the housing 2 and opens into the hot gas chamber. The heat pipes 3 are arranged to open in the opposite directions, but in a staggered relation with respect to each other. In other words, the heat pipes 3 are not coaxial. This arrangement is effective to produce a swirl of hot gas in the hot gas chamber, as best shown in FIG. 2, thereby making uniform the temperature of the hot gas blown out through the holes 13.

Figure 4:
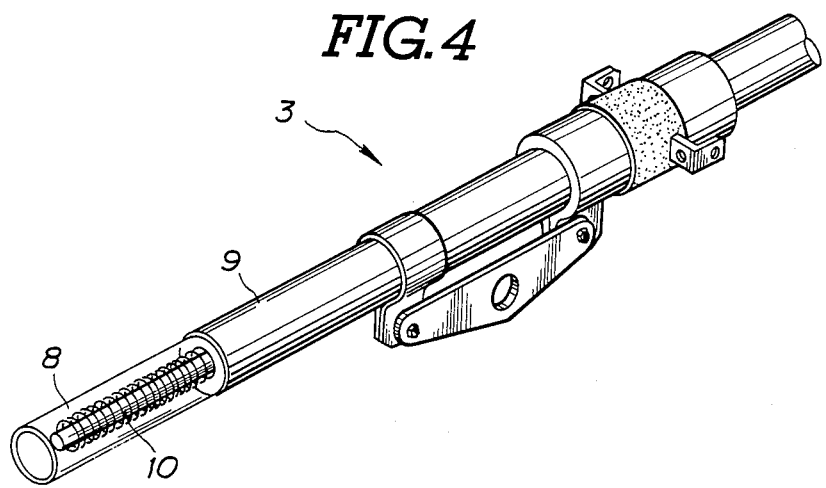
FIG. 4 is an enlarged fragmentary perspective view of the heat pipe.

Referring to FIG. 4, the heat pipe 3 includes an inner pipe 8 having its circumferential surface covered with a sealed stainless outer pipe 9. Preferably, the inner pipe 8 is made of transparent quartz. A heater coil element 10 is wound on a support rod extending along the axis of the inner pipe 8. The heat pipe 3 opens at its one end into the hot gas chamber and it is connected at the other end thereof to an unshown air compressor. The air compressor introduces air under pressure through the heat pipe 3 into the hot gas chamber. The heater element 10 has a supply of electric current from a power source (not shown) for heating the airflowing through the heat pipe 3 to convert the air into hot gas therein.

Figure 5:
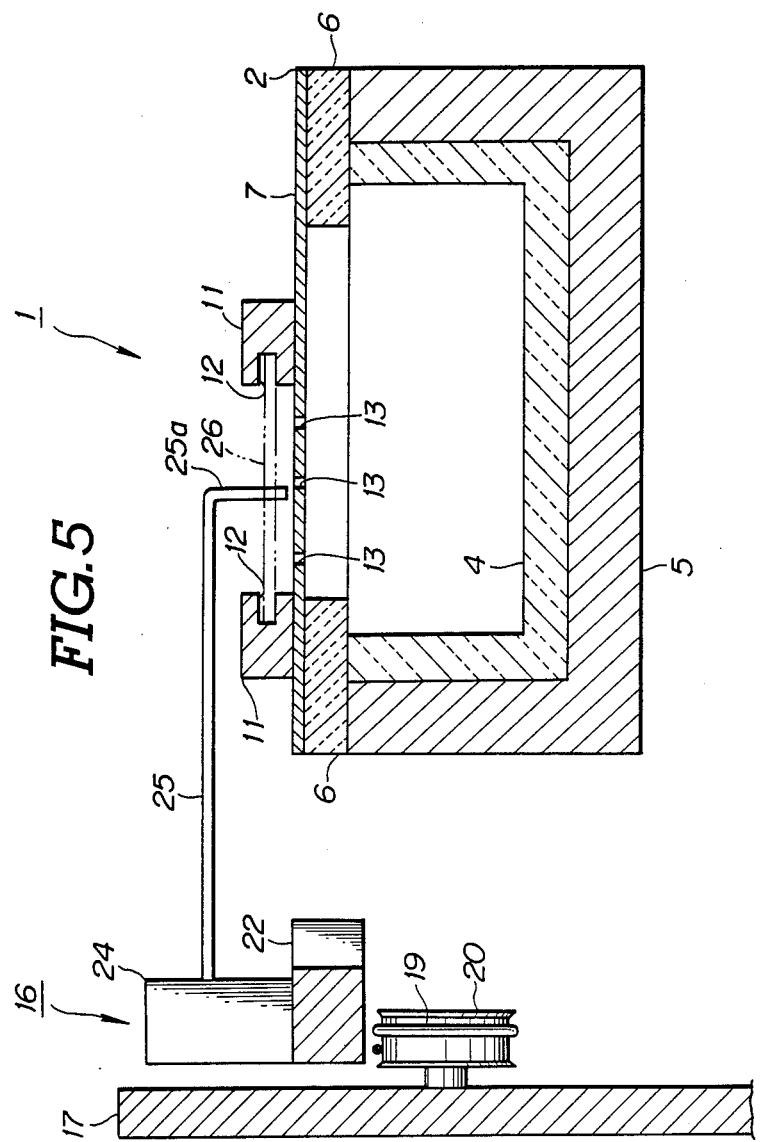
FIG. 5 is a section taken on line V—V in FIG. 1.

As best seen in FIGS. 1 and 5, the housing top plate 7 carries a pair of guide rails 11 extending substantially the full length of the top plate 7 in a parallel-spaced relation on the opposite sides of the perforated portion thereof. The guide rails 11 are formed on their side surfaces with grooves 12 facing each other for insertion of the opposite side edges of a substrate 26, as best shown in FIG. 5.

The reflow soldering apparatus also includes input and output belt conveyers 14 and 15 installed near the input and output ends of the guide rails 11, respectively. The input belt conveyer 14 has a pair of endless belts 14a extending in parallel-spaced relation. Each of the endless belts 14a is journalled between a pair of pulleys (not shown) and driven through a transmission mechanism by an electric motor 14b. In order to facilitate insertion of a substrate into the guide grooves 12 from the input belt conveyer 14, it is preferable to position the endless belts 14a in such a manner that their upper surfaces are co-planar with the lower surfaces of the opposed guide grooves 12 formed in the respective guide rails 11, as best shown in FIG. 6. Similarly, the output belt conveyer 15 has a pair of endless belts 15a extending in parallel-spaced relation. Each of the endless belts 15a is journalled between a pair of pulleys (not shown) and driven through a transmission mechanism by an electric motor 15b. In order to facilitate discharge of the substrate from the guide grooves 12 onto the output belt conveyer 15, it is preferable to position the endless belts 15a in such a manner that their upper surfaces are co-planar with the lower surfaces of the opposed guide grooves 12, as best shown in FIG. 6. A cooling fan 30 is provided between the endless belts 15a near the output end of the output belt conveyer 15 for cooling the substrate 26. The input belt conveyer 14, the guide rails 11, and the output belt conveyer 15 constitute a path of conveyance for the substrate 26 through the apparatus 1.

A substrate shifting device, designated generally by the numeral 16, is provided for shifting a substrate from the input belt conveyer 14 onto the guide rails 11 and also shifting the substrate from the guide rails 11 to the output belt conveyer 15. The substrate shifting device 16 includes a support plate 17 positioned on one side of the housing 21. The numeral 22 designates a base member with a slider 23 projecting therefrom into a guide groove (not shown) formed in the support plate 17 for permitting sliding movement of the base member 22 in a direction parallel to the substrate conveyance path. The base member 22 has a pair of upright support shafts 24 secured on the opposite ends thereof. The support shafts 24 supports respective shifting arms 25 which extend in a parallel-spaced relation toward the substrate conveyance path. Each of the shifting arms 25 has a shifting pawl 25a turned downward at a position substantially intermediate between the guide rails 11, as best shown in FIG. 5. A mechanism (not shown) is provided to move the shifting arms 25 vertically along the respective support shafts 24. The base member 22 is moved by means of a cord 19 journalled between a pair of pulleys 18 mounted rotatably on the support plate 17. A drive pulley 20 is also mounted rotatably on the support plate 17 and has two turns of the cord 19 wound thereon. The drive pulley 20 is driven by a bi-directional electric motor 21 to circulate the cord 19 so as to move the base member 22 in directions parallel to the substrate conveyance path.

Referring to FIG. 6, the substrate 26 is shown as positioned between the guide rails 11 just above the perforated portion having the holes 13 through which hot gas is blown out toward the substrate 26. The substrate 26 has a chip part 27 with its terminals 27a temporarily fixed by cream solder 28 on the land provided on the upper surface of the substrate 26 and lead parts 29 with their lead wires 29a temporarily fixed by cream solder 28 on the land provided on the lower surface of the substrate 26.

The operation is as follows:

First of all, the hot gas blower heaters 10 are powered to heat the air flowing through the respective heat pipes 3 into the hot gas chamber, the electric motor 14b is powered to drive the input belt conveyer 14, and the electric motor 15b is powered to drive the output belt conveyer 15. A substrate 26, which has electrical parts temporarily fixed thereon by means of cream solder, is conveyed on the input belt conveyer 14 toward the guide rails 11. When the substrate 26 arrives at a postion where its front end portion is inserted between the guide grooves 12, the shifting arms 25 are lowered to bring its shifting arms 25a to the position adjacent to the opposite ends of the substrate 26. Following this, the electric motor 21 is powered to move the base member 22 so as to permit the shifting arms 25 to move the substrate 26 along the guide rails 11 over the perforated portion of the housing 2 of the hot gas generator. During the movement of the substrate 26 over the perforated portion, the substrate 26 is exposed to a flow of hot gas blown through the holes 13 from the hot gas chamber and the cream solder, which is used to fix the electrical parts temporarily on the substrate 26, is melted and re-solidified under the heat of the blown hot gas. When a major portion of the substrate 26 moves onto the output belt conveyer 15, the support arms 25 are elevated to their initial position and the substrate 26 is conveyed onto the output belt conveyer 15. The substrate 26 is cooled by the cooling fan 30 just before it is discharged from the outlet belt conveyer 15.

According to the invention, the substrate is exposed to the hot gas blow out through the holes 13. Therefore, the reflow soldering apparatus can be used to solder parts when the substrate is curved somewhat or when soldering is required only for a part of the substrate. The substrate is moved at a distance from the housing perforated portion. This is effective to permit the simultaneous soldering of lead and chip parts. In addition, according to the present invention, it is easy to adjust the temperature of the hot gas blown out of the hot gas generator, for example, by controlling the current flow to the heater elements 10. Therefore, the reflow soldering apparatus 1 can be used to solder thermolabile parts and does not degrade the reliability of the soldered parts even after twice reflowing the parts.

While this invention has been described in conjunction with specific embodiments thereof, it is evident that many alternatives, modifications and variations will be apparent to those skilled in the art. Accordingly, it is intended to embrace all alternatives, modifications and variations that fall within the scope of the appended claims.

What is claimed is:

1. A reflow soldering apparatus for soldering parts which are temporarily fixed on a substrate by means of cream solder, the apparatus comprising:
   a hot gas blower provided with a number of holes for blowing hot gas through the holes; and
   means for moving the substrate along the hot gas blower at a distance therefrom to expose the substrate to hot gas blown through the holes during movement of the substrate, thereby reflowing the cream solder.

2. The apparatus as claimed in claim 1, wherein the hot gas blower includes a housing defining a hot gas chamber, the housing having a perforated portion provided with the holes, and a hot gas generator for introducing hot gas into the hot gas chamber.

3. The apparatus as claimed in claim 2, wherein the hot gas generator has two outlets arranged to open into the hot gas chamber in opposite directions and in a staggered relation with respect to each other so as to produce a swirl of hot gas in the hot gas chamber.

4. The apparatus as claimed in claim 2, wherein the moving means includes a pair of guide rails placed in parallel-spaced relation on the opposite sides of the perforated portion for guiding the movement of the substrate relative to the hot gas blower.

5. The apparatus as claimed in claim 4, wherein the moving means includes means for carrying the substrate onto the guide rails and means for carrying the substrate away from the guide rails.

6. A reflow soldering apparatus for soldering parts which are temporarily fixed on a substrate by a solder while moving said substrate along a path of conveyance through a solder reflow zone, comprising:

first means for conveying said substrate with said parts temporarily fixed thereto along said path of conveyance to said solder reflow zone;

means for causing said solder to reflow on said substrate, said solder reflow means being positioned in said solder reflow zone and including a hot gas blower provided with a number of holes through which a hot gas blows into said solder reflow zone and onto said substrate while moving along said path of conveyance through said solder reflow zone;

means for moving the substrate along said path of conveyance from said first conveying means along the hot gas blower in said solder reflow zone at a distance therefrom to expose the substrate to hot gas blown through said holes during movement of the substrate relative to said hot gas blower, thereby reflowing the solder; and second means for conveying said substrate from said solder reflow zone with said parts fixed thereto by reflowed solder.

7. The apparatus as set forth in claim 6, wherein said hot gas blower comprises a housing defining a hot gas chamber and a perforated portion defining the holes, and a hot gas generator for introducing hot gas into the hot gas chamber to be blown through said holes during movement of said substrate along said path of conveyance through said solder reflow zone.

8. The apparatus as set forth in claim 7, wherein said hot gas generator includes at least a pair of heat pipes, each respectively extending through a side wall of the housing and opening into the hot gas chamber from opposite directions, and arranged in a non-coaxial relationship to produce a swirl of hot gas in the hot gas chamber to make uniform the temperature of the hot gas blown from the chamber through the holes.

9. The apparatus as set forth in claim 6, wherein said housing includes a pair of guide rails extending substantially along the full length of said housing in a parallel-spaced relation on the opposite sides of said perforated portion, said guide rails being formed to receive opposite side edges of said substrate for movement therealong; and means for moving said substrate while engaged with said guide rail.

10. The apparatus as set forth in claim 6 wherein said first conveying means and said second conveying means each includes a pair of endless belts extending in a parallel-spaced relation and acting respectively as an input belt conveyor and an output belt conveyor, upper surfaces of said belts being respectively coplanar with surfaces of the opposed guide grooves, said input belt conveyor, said guide rails, and said output belt conveyor comprising said path of conveyance for the substrate through the reflow soldering apparatus.

11. The apparatus as set forth in claim 10 further including means for shifting said substrate from said input belt conveyor onto said guide rails and from said guide rails onto said output belt conveyor.

12. The apparatus as set forth in claim 11 wherein said substrate shifting means is laterally translatable relative to said reflow soldering zone for sliding movement in a direction parallel to the substrate conveyance path, said device including means for engaging said substrate for movement through said reflow soldering zone with movement of said device.

* * * * *